United States Patent
Nagle et al.

(10) Patent No.: US 6,813,319 B1
(45) Date of Patent: Nov. 2, 2004

(54) SYSTEM AND METHOD FOR TRANSMITTING DIGITAL INFORMATION USING INTERLEAVED DELTA MODULATION

(75) Inventors: Pierce Joseph Nagle, Cork (IE); Finbarr Joseph McGrath, Westford, MA (US); Eugene Patrick Heaney, Cork (IE); David Philip Burton, Limerick (IE)

(73) Assignee: M/A-Com Eurotec, Blackrock Cork (IE)

( * ) Notice: Subject to any disclaimer, the term of this patent is extended or adjusted under 35 U.S.C. 154(b) by 133 days.

(21) Appl. No.: 09/680,686

(22) Filed: Oct. 6, 2000

(30) Foreign Application Priority Data

Oct. 8, 1999 (EP) ............................................. 99119900

(51) Int. Cl.[7] ............................................... H03C 5/00
(52) U.S. Cl. ...................................... 375/302; 375/297
(58) Field of Search ................................ 375/261, 271, 375/285, 295, 296, 297, 298, 302, 377; 330/10, 127, 149; 455/91, 102, 114.2, 114.3

(56) References Cited

U.S. PATENT DOCUMENTS

| | | | |
|---|---|---|---|
| 4,164,714 A | | 8/1979 | Swanson ..................... 330/10 |
| 5,105,164 A | * | 4/1992 | Fisher et al. ................ 330/149 |
| 5,249,201 A | | 9/1993 | Posner et al. ............... 375/295 |
| 5,831,475 A | * | 11/1998 | Myers et al. ................. 330/10 |
| 5,847,602 A | * | 12/1998 | Su .............................. 330/10 |
| 5,886,572 A | | 3/1999 | Myers et al. ................. 330/10 |
| 5,886,573 A | * | 3/1999 | Kolanek ...................... 330/10 |
| 5,973,556 A | * | 10/1999 | Su .............................. 330/10 |
| 5,990,735 A | * | 11/1999 | Sigmon et al. ............... 330/10 |
| 6,112,062 A | * | 8/2000 | Hans et al. ............. 455/114.3 |
| 6,130,910 A | | 10/2000 | Anderson et al. .......... 375/238 |
| 6,600,369 B2 | * | 7/2003 | Mitzlaff ....................... 330/149 |

FOREIGN PATENT DOCUMENTS

| | | | |
|---|---|---|---|
| EP | 0 385 641 A2 | 9/1990 | ............. H03F/1/32 |
| EP | 0 863 607 A1 | 9/1998 | ............. H03F/1/02 |

OTHER PUBLICATIONS

Koch M J et al: "A High Efficiency 835 MHZ Linear Power Amplifier For Digital Cellular Telephony", 39th IEEE Vehicular Technology Conference, vol. 1, May 1, 1989, pp. 17–18.

Kahn L R : "Single–Sideband Transmission By Envelope Elimination And Restoration", Proceeding of the I.R.E., Jul. 1952, pp. 803–806.

Jayaraman a et al: "Linear High–Efficiency Microwave Power Amplifiers Using Bandpass Delta–Sigma Modulators", IEEE Letters, vol. 8, No. 3, Mar. 1, 1998, pp. 121–123.

IEEE Journal of Solid–State Circuits, vol. 33, No. 12, Dec. 1998: aN IC for Linearizing RF Power Amplifiers Using Envelope Elimination and Restoration, David K. Su, and William J. McFarland. pp. 2252–2258.

* cited by examiner

*Primary Examiner*—Chieh M. Fan

(57) ABSTRACT

A transmitter for directly modulating an RF carrier with a complex baseband waveform comprises a programmable device adapted to generate amplitude and phase information collectively corresponding to a complex baseband waveform, a signal generator adapted to generate an RF carrier whose phase is responsive to phase information generated by the programmable device, a plurality of delta modulators, and an amplifier coupled to the signal generator and receiving the RF carrier with phase information. Each delta modulator is operative to sample an error signal at a time period offset from all other delta modulators to thereby generate streams of pulses collectively approximating the amplitude information. The supply voltage of the amplifier is adjusted in accordance with approximated amplitude information represented by the streams of pulses generated by the delta modulators. Specifically, the supply voltage is adjusted such that the output voltage of the amplifier varies substantially linearly with changes in the supply voltage. In this manner, both the amplitude information and the phase information are both impressed upon the RF carrier.

9 Claims, 16 Drawing Sheets

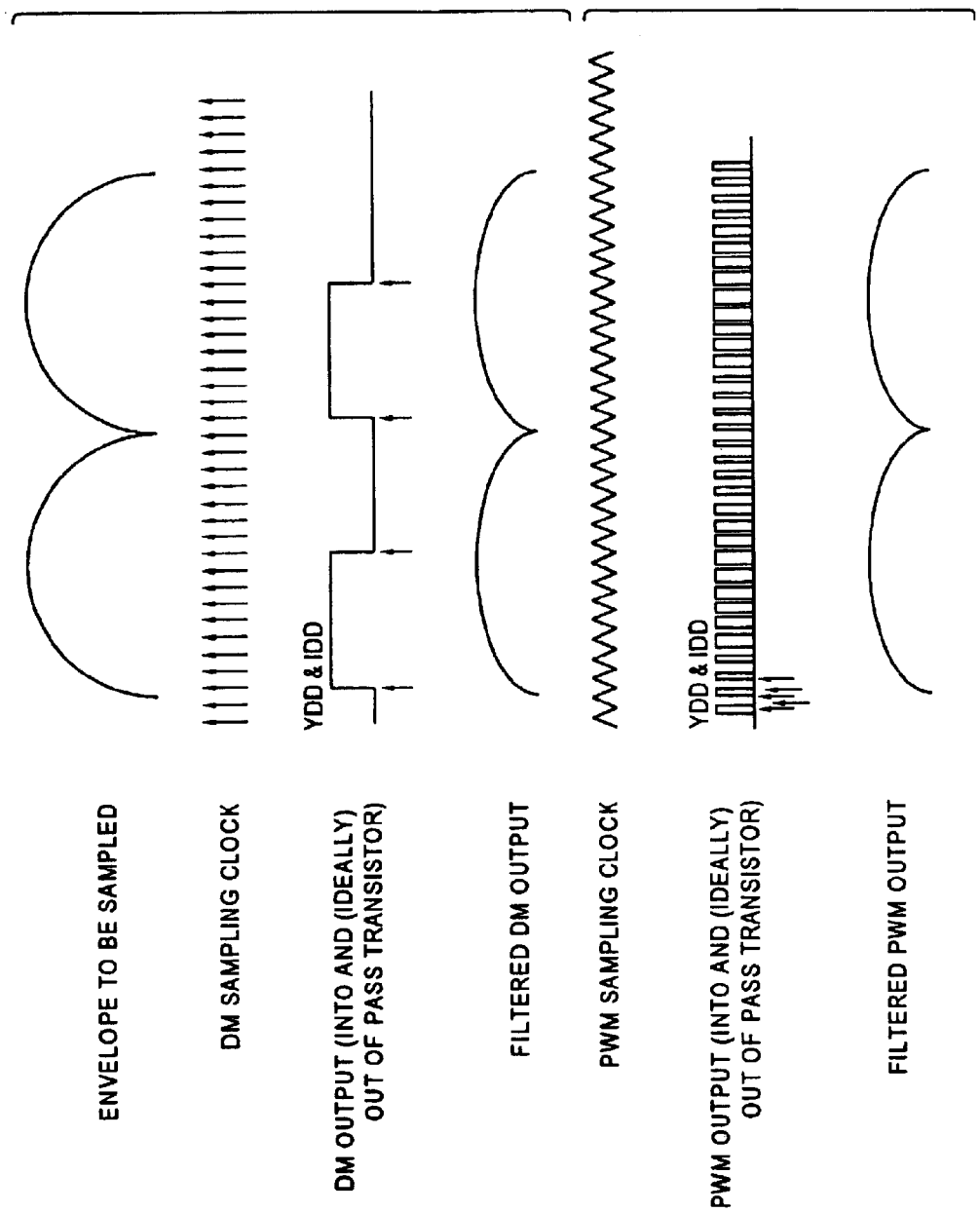

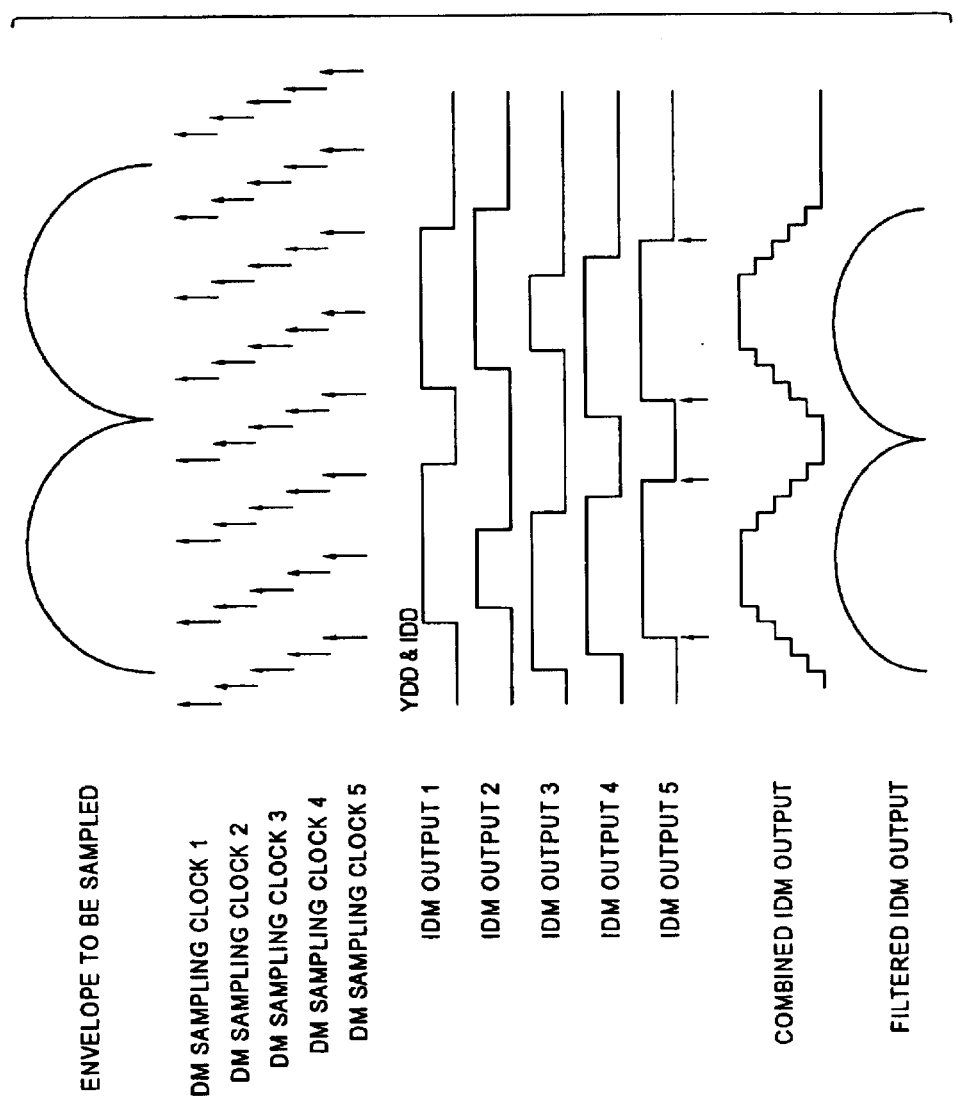

SYSTEM AND METHOD FOR TRANSMITTING DIGITAL INFORMATION USING INTERLEAVED DELTA MODULATION

BACKGROUND OF THE INVENTION

1. Field of the Invention

The present invention relates generally to power amplifiers and, more particularly, to a method and apparatus for linearizing a power amplifier.

2. Discussion of the Background Art

Competition has led to rapid and sweeping innovations in cellular telephone technology. Analog cellular systems are now competing with digital cellular systems. In order to maximize the number of subscribers that can be serviced in a single cellular system, frequency reuse is maximized by making individual cell sites smaller and using a greater number of cell sites to cover the same geographical area. Accordingly, the increased number of cellular base stations has resulted in increased infrastructure costs. To offset this increased cost, cellular service providers are eager to implement any innovations that may reduce equipment costs, maintenance and repair costs, and operating costs, or that may increase service quality and reliability, as well as the number of subscribers that the cellular system can service.

Much of this innovation has focused on service quality improvements, such as expanded digital PCS services or smaller and lighter cellular phone handsets having a longer battery life. In pursuit of the latter objective, an appreciation has developed for ways to improve the efficiency of the RF power amplifier which is used to amplify the RF signal to a level suitable for transmission within the network. The efficiency of an RF power amplifier has a significant impact on the battery life of a portable device, such as a portable transmitter, because the amplifier typically consumes the most amount of power used by the device. Efficient power amplifiers are therefore highly desirable for portable transmitters. Efficient class C, D, E, and F power amplifiers are only capable of generating constant-amplitude outputs. However, many recent transmitter designs require a non-constant amplitude RF output to maximize the data rate within a given channel bandwidth.

A suitable linear RF amplifier may be manufactured using gallium arsenide devices. However, gallium arsenide devices are presently considered too expensive for many applications. While MOS is the preferred process for manufacturing semiconductor devices, due to its low cost of fabrication and high yields, MOS has traditionally been unsuitable for fabricating linear RF amplifiers due to its lack of linearity when used to implement a high efficiency amplifier. Such poor linearity introduces a significant amount of distortion into the amplifier's output signal. Many different linearization schemes have been proposed in the art to achieve a linear and efficient power amplifier.

The design of traditional linear power amplifiers normally involves a trade-off between efficiency and linearity. Polar modulation is a technique known in the art that simultaneously achieves linearity and efficiency in an RF power amplifier. Polar modulation is also known as envelope elimination and restoration (EER). In this approach, an RF input signal is decomposed into its polar components, i.e., phase and magnitude. These two polar components are amplified independently and are then recombined to generate an amplified, linear RF output signal. The phase component of the RF input signal is typically amplified by a constant-amplitude amplifier that is optimized for efficiency. The magnitude or envelope component of the RF input signal is typically amplified by a switching-mode power supply that operates as the power supply for at least the output stage of the constant-amplitude amplifier.

Various approaches to the use of polar modulation have been described by L. Kahn, Single-Sided Transmission by Envelope Elimination and Restoration, Proc. IRE, July 1952, pp. 803–806; and by M. Koch, R. Fisher, a High-Frequency 835 MHz Linear Power Amplifier for Digital Cellular Telephony, 39th IEEE Vehicular Technology Conference, 3 May 1989. FIG. 1 is a block schematic diagram of a traditional RF amplifier 10 that employs the above-described envelope elimination and restoration technique. In the amplifier shown in FIG. 1, an RF input signal 12 is first decomposed into its polar components. These polar components comprise phase, which is a constant-amplitude signal, and magnitude, which is a low-frequency envelope signal. The phase and magnitude components are amplified independently along separate paths 15 and 11, respectively. The phase and magnitude components are then recombined to generate the linearly-amplified RF output signal 19.

The phase component is extracted from the RF input signal by the limiter 16, and is amplified by an efficient constant-amplitude amplifier that may comprise the non-linear preamplifier 17, and the efficient, non-linear phase output stage 18. The magnitude component, which has a bandwidth comparable with the channel bandwidth, is extracted from the RF input signal by the envelope detector 13, and is amplified by the linear baseband amplifier 14. To maximize efficiency, the linear baseband amplifier 14 is implemented using a switching-mode power supply having a class-D amplifier as its output stage.

Existing implementations of switching-mode power supplies use pulse width modulation. The output of such a power supply is a square wave whose mark/space ratio represents the magnitude component of the RF input signal. However, using pulse width modulation to amplify the magnitude component introduces intermodulation distortion into the RF output. It is therefore desirable to provide a high efficiency RF amplifier that can be fabricated using a low-cost process, such as MOS, and that provides linear amplification of the RF input signal.

SUMMARY OF THE INVENTION

The aforementioned objective is achieved, and an advance is made in the art, by a transmitter for directly modulating an RF carrier with a complex baseband waveform that comprises a programmable device adapted to generate amplitude and phase information collectively corresponding to a complex baseband waveform, a signal generator adapted to generate an RF carrier whose phase is responsive to phase information generated by the programmable device, a plurality of delta modulators, and an amplifier coupled to the signal generator and receiving the RF carrier with phase information. Each delta modulator is operative to sample an error signal at a time period offset from all other delta modulators to thereby generate streams of pulses collectively approximating the amplitude information. The supply voltage of the amplifier is adjusted in accordance with approximated amplitude information represented by the streams of pulses generated by the delta modulators. Specifically, the supply voltage is adjusted such that the output voltage of the amplifier varies substantially linearly with changes in the supply voltage. In this manner, both the amplitude information and the phase information are both impressed upon the RF carrier.

A method of operating a transmitter to transmit a complex baseband waveform modulated onto an RF carrier comprises the steps of receiving amplitude information derived from the complex baseband waveform, receiving an RF carrier bearing phase information derived from the complex baseband waveform, and sampling, with a plurality of delta modulators, an error signal with each delta modulator sampling the error signal at a time period offset from all the other modulators to thereby generate streams of pulses collectively approximating the amplitude information. The method further comprises a step of receiving the RF carrier with phase information at an amplifier, and adjusting a supply voltage of the amplifier in accordance with the approximated amplitude information represented by the streams of pulses output by the delta modulators such that the output voltage of the amplifier varies substantially linearly with changes in the supply voltage, whereby the amplitude information and phase information are both impressed upon the RF carrier.

BRIEF DESCRIPTION OF THE DRAWINGS

For a more complete understanding of the present invention, and the advantages thereof, reference is now made to the detailed description which follows taken in conjunction with the accompanying drawings, wherein like numbers designate like objects, and in which:

FIGS. 10A–10C are graphical representations comparing of the results and methodology of the PWM and DM techniques, to the IDM technique of the presentation;

DETAILED DESCRIPTION OF THE INVENTION

Figure 1:
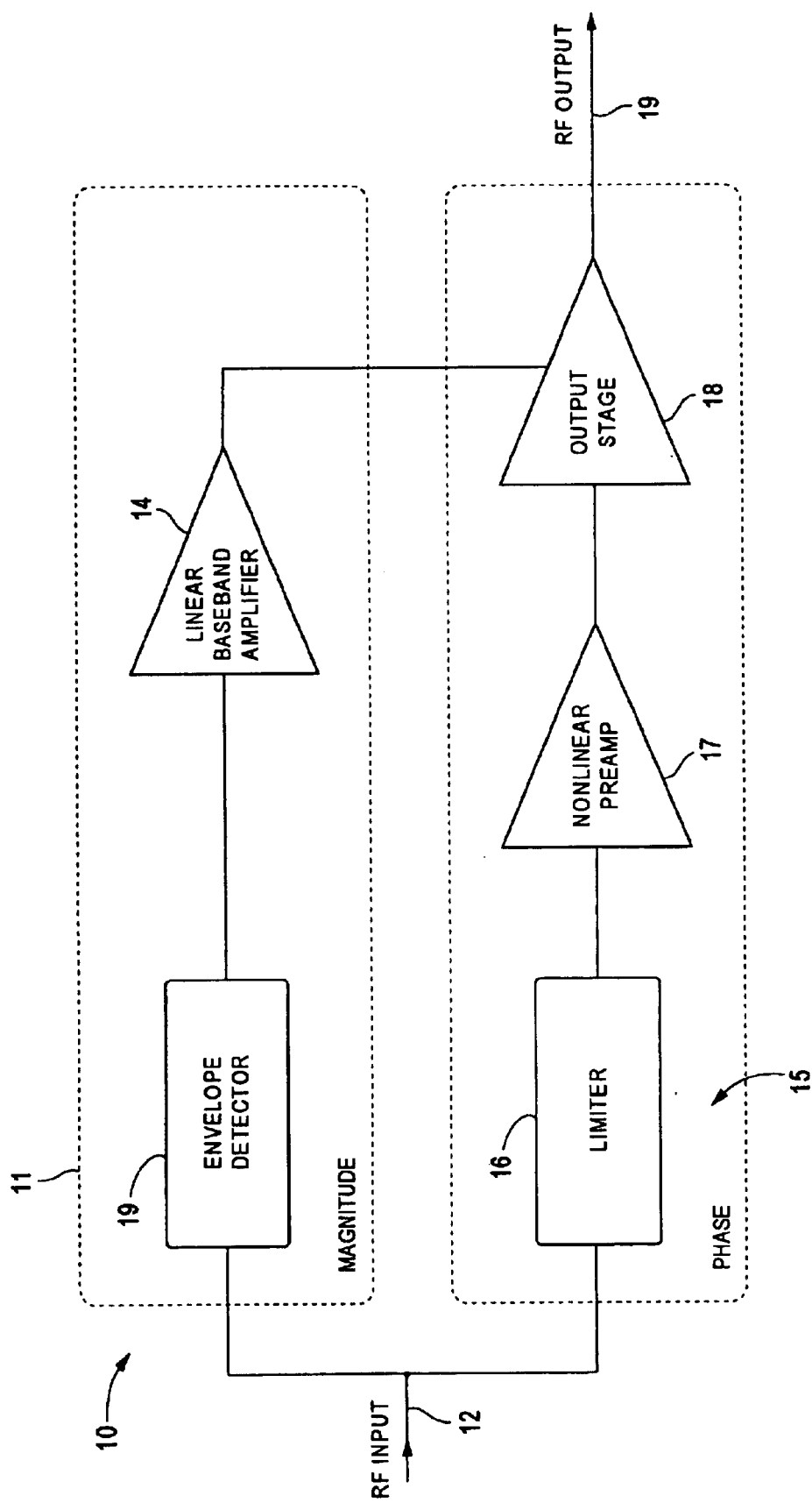
FIG. 1 is a block schematic diagram of a conventional RF amplifier employing envelope elimination and restoration.

The invention provides an efficient, highly linear RF power amplifier that is based, in part, upon the polar modulation concept discussed above in connection with FIG. 1. The preferred embodiment of the invention includes a phase amplification path in which the constant-amplitude phase component of the RF input signal is amplified. The phase amplification path includes a highly efficient, non-linear phase output stage that may be a Class C output stage, a Class D output stage, a form of Class E output stage or a Class F output stage. Essentially, any highly efficient power amplifier whose output amplitude linearly tracks the applied power supply voltage can be used. The magnitude component of the RF input signal is amplified in a separate magnitude amplification path via a unique, efficient, interleaved delta modulation scheme, which will be described in detail shortly. The output stage of the interleaved delta modulated magnitude amplifier is preferably a highly efficient Class D, E or F amplifier that provides the power supply voltage for the phase output stage. The amplified magnitude component output by the interleaved-delta-modulated magnitude amplifier amplitude modulates the RF output signal generated by the phase output stage by varying the power supply voltage of the phase output stage.

For a given level of linearity, which is normal fixed as an operating parameter of the communication network in which a handset is used, the pulse width and delta modulation magnitude amplifier schemes employed by prior art modulation systems consume more power in the production of an RF output signal than is consumed with the aid of the interleaved delta modulation magnitude amplifier of the present invention. Accordingly, the invention provides a more efficient modulation scheme than that provided by the prior art.

Figure 2:
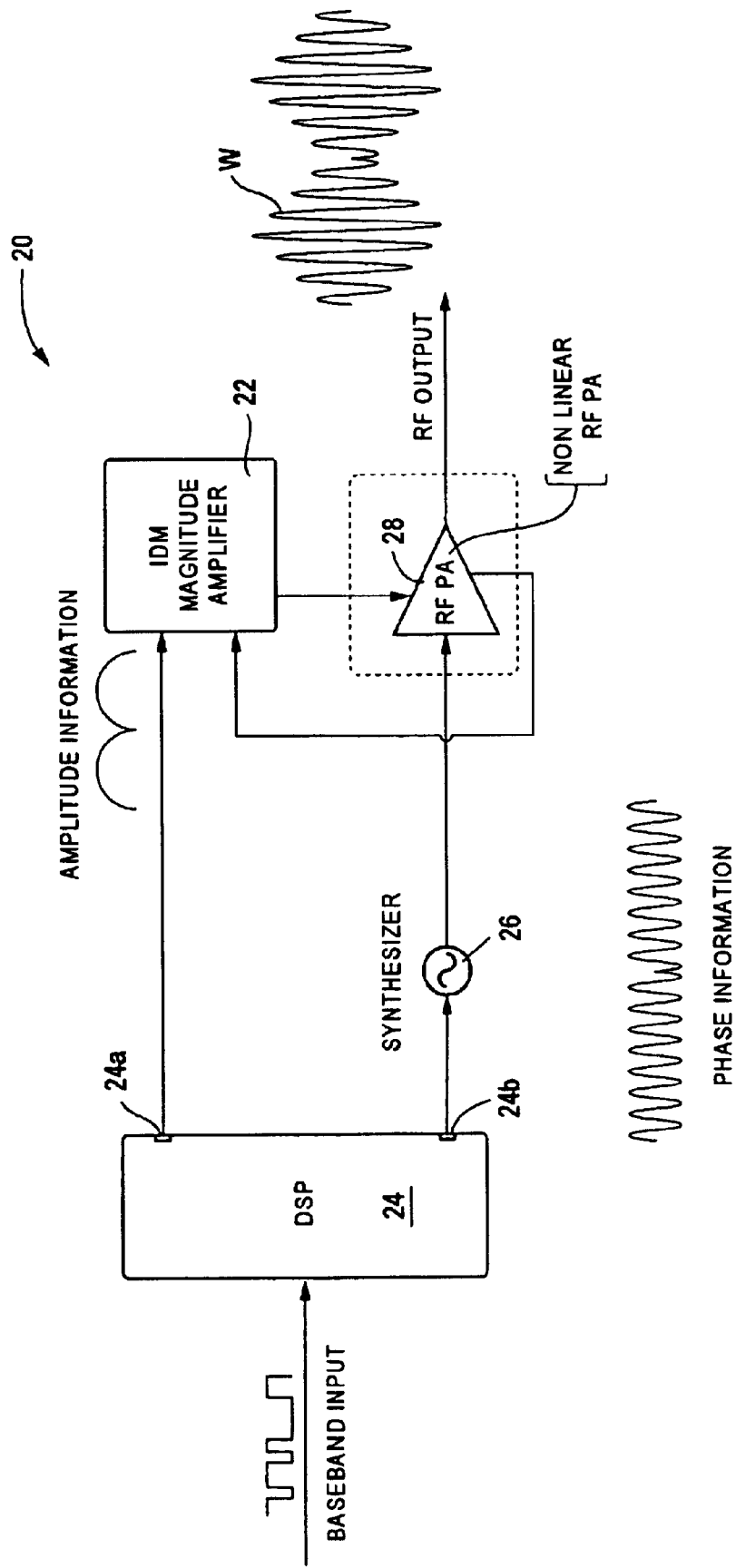
FIG. 2 is a block schematic diagram of a DSP based, RF amplifier employing interleaved delta modulation in accordance with the present invention.

FIG. 2 is a simplified block schematic diagram of an amplifier 20 incorporating interleaved delta modulation according to a preferred embodiment of the present invention. The interleaved delta modulation (IDM) magnitude amplification module 22 employed in the configuration shown in FIG. 2 is suitable for use in the magnitude amplification path of an RF power amplifier such as that shown in FIG. 1. However, in the illustrative embodiment depicted in FIG. 2, it will be seen that rather than receiving an input RF signal which must first undergo envelope elimination to resolve the complex baseband waveform into separated phase and magnitude information signals (as is the case in FIG. 1) before independent processing in accordance with the present invention can proceed, the amplifier 20 of FIG. 2 employs a programmable device such, for example, as a digital signal processor (DSP) 24 to separately generate and supply the magnitude and phase information signals at separate output ports 24a and 24b. These information signals collectively correspond to the selected complex baseband waveform to be transmitted, ultimately, as the amplified RF output signal. Thus, and as seen in FIG. 2, the need for a limiter and envelope detector is obviated, and the respective amplitude and phase signals are output at ports 24a and 24b of DSP 24.

With continued reference to FIG. 2, it will be seen that the phase information is directed to a signal generator or synthesizer 26 which generates an RF carrier whose phase is responsive to phase information generated by DSP 24. The RF carrier is thus a high-frequency, constant envelope signal containing only the phase information, not the magnitude information. The RF carrier is efficiently amplified by the non-linear power amplifier 28. In accordance with the present invention, the power supply of power amplifier 28 is modulated by the low frequency magnitude information signal that is produced by DSP 24. To that end, the magnitude information is directed to an interleaved delta modulation (IDM) module 22 which, as will be explained in greater detail later, generates a time interleaved digital bit stream that represents an approximation of the magnitude component of the complex baseband waveform to be transmitted. For now, it suffices to say that IDM module 22 includes a plurality of delta modulators, with each delta modulator being operative to sample an error signal at a time period offset from all other delta modulators with their respective outputs being combined to generate streams of pulses collectively approximating the approximation of the magnitude component of the complex baseband waveform W to be transmitted. In accordance with the present invention, it is this time interleaved stream of digital pulses which modulates the power supply of power amplifier 28.

Figure 3:
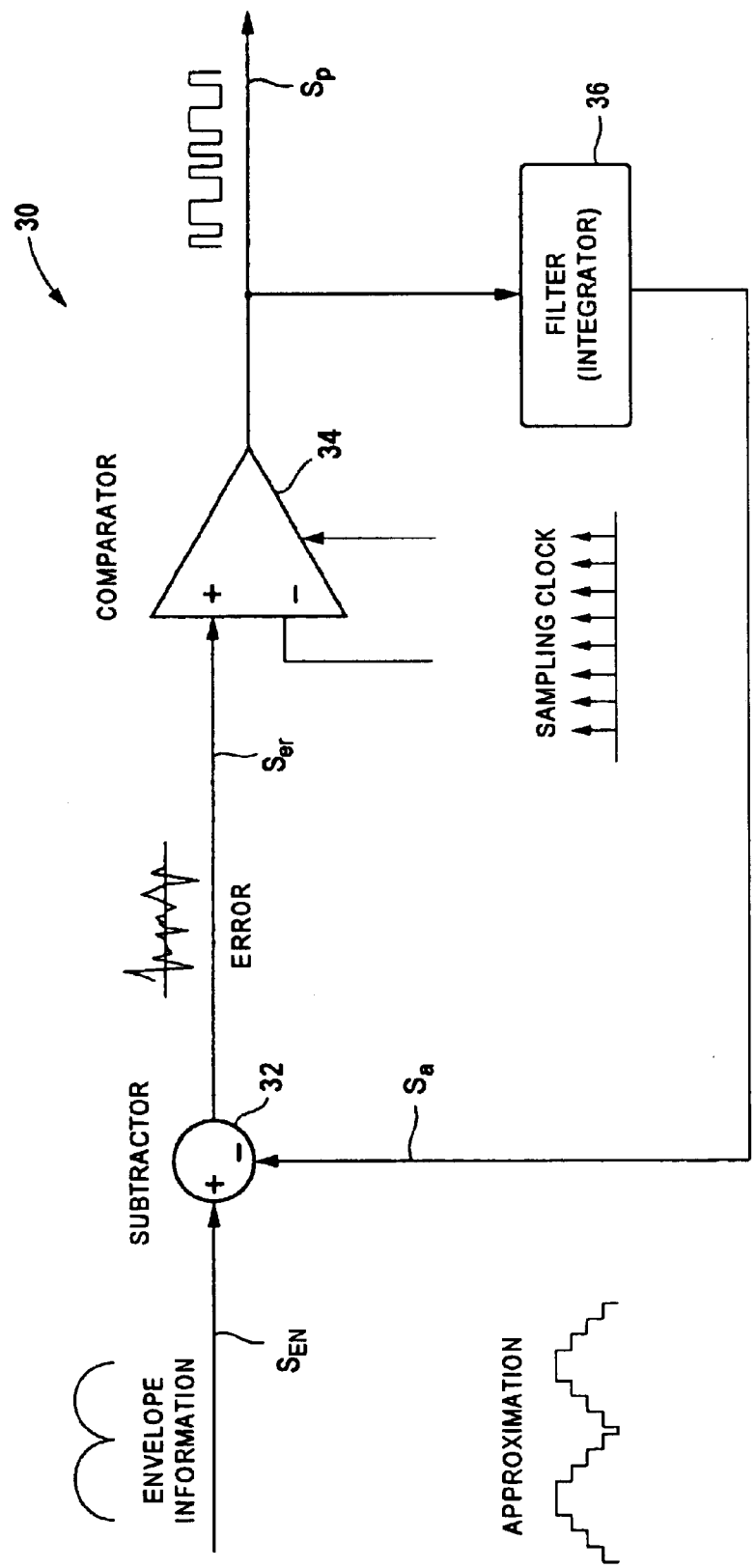
FIGS. 3 and 4 depict block schematic diagrams of conventional delta modulation according to one embodiment of the prior art.
Figure 4:
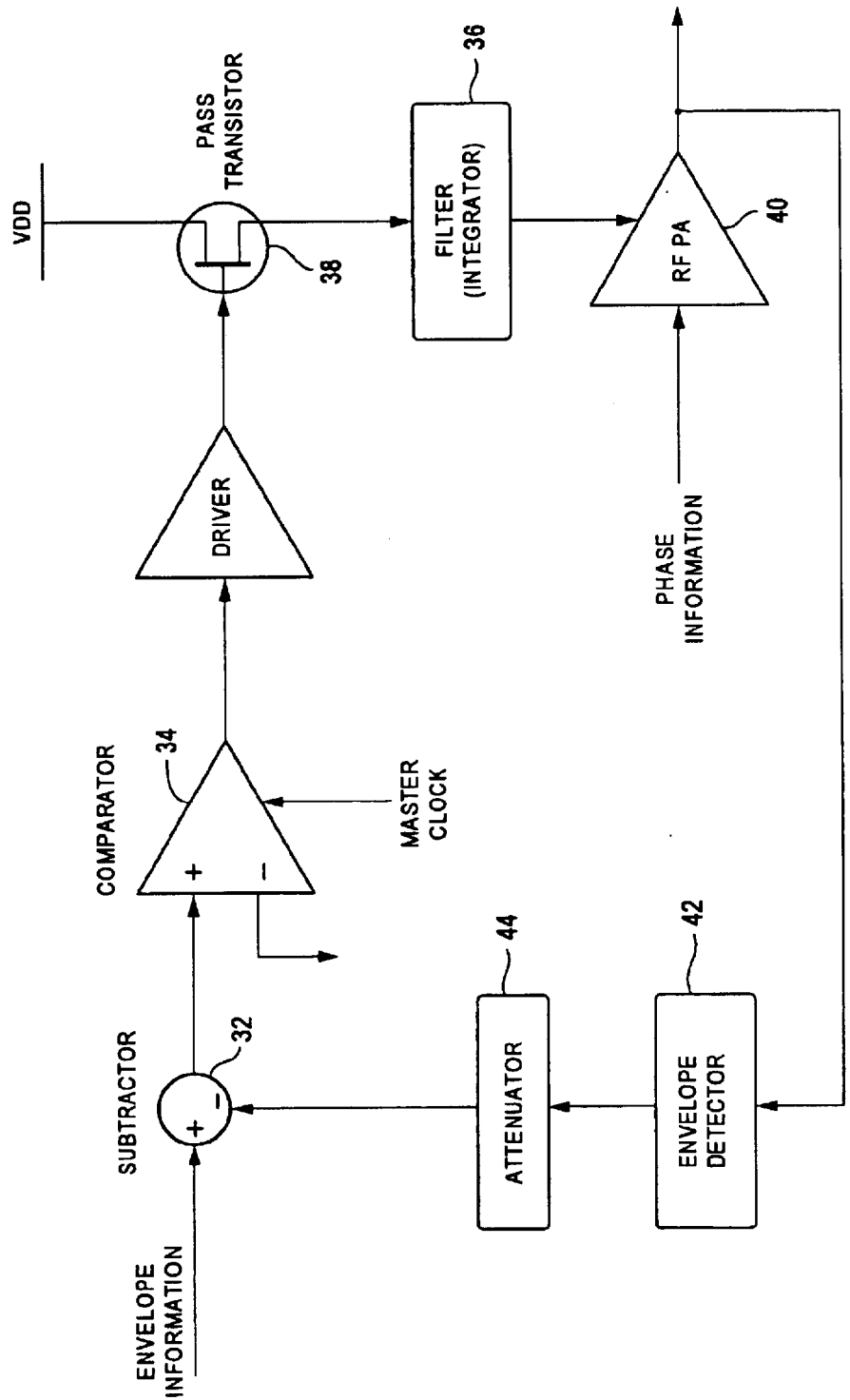

The use of interleaved delta modulation to drive a power amplifier in accordance with the present invention represents a significant advance over a conventional Delta Modulation (DM) technique, of which FIG. 3 is a simplified block diagrammatic depiction. It will be appreciated by those skilled in the art that in a standard DM configuration 30, an input envelope signal $S_{en}$ (bearing only the low frequency magnitude information component of the complex baseband waveform) is compared to an approximation $S_a$ of the envelope to generate an error signal $S_{er}$. A feedback loop comprising a subtractor 32 attempts to minimize error signal $S_{er}$, ensuring that the approximation is as close as possible to the input signal. To this end, error signal $S_{er}$ is sampled by a single bit comparator 34 to produce a stream of digital pulses $S_p$. The stream of pulses $S_p$ is then D/A converted by a filter/integrator 36 to produce the approximation which is then compared with the input envelope signal $S_{en}$ at subtractor 32. In a complete transmitter-receiver system, the pulses output by comparator 34 would be integrated at the receiver end to recover the approximation signal. A more complete conventional DM scheme is shown in FIG. 4, which further shows the output of single bit comparator 34 being applied to the gate of pass transistor 38, whereby the supply voltage applied to RF power amplifier 40 is modulated to restore the amplitude, with the appropriate amount of gain, to the RF carrier bearing only the phase information. An envelope detector 42 and attenuator 44 process the feedback signal from power amplifier 40 for comparison thereof in subtractor 32.

A principal advantage of the simple DM scheme over pulse width modulation is that there are far fewer transitions and it can be implemented using relatively simple and robust switched capacitor circuits employing CMOS technology. It will be readily appreciated by those skilled in the art that to get adequate linearity, at least 3 times the RF bandwidth of a signal must be accurately sampled. In fact, the higher the switching (sampling) frequency relative to the envelope, the easier it is to pass the envelope and inhibit the switching harmonics associated with operation of the pass transistor. For the wide bandwidth signals contemplated now and in the future, the sampling rate therefore needs to be very high. In PWM, for example, the sampling frequency would typically need to be greater than 20 times so that the harmonics of the switching frequency do not interfere with the envelope signal (e.g., for a bandwidth of 30 KHz, the sampling frequency must be at least 1.8 MHz). However, even for conventional DM, if the sampling frequency is too high, there are issues of excessive switching loss in the pass transistor, electromagnetic interference, and over voltage. Thus, while the DM amplifier does not require a saw-tooth waveform generator and allows a relatively higher sampling frequency than the pulse width modulation approach, there is a limit in sampling frequency beyond which cross-over losses and other concerns cause a substantial degradation in efficiency.

Figure 5:
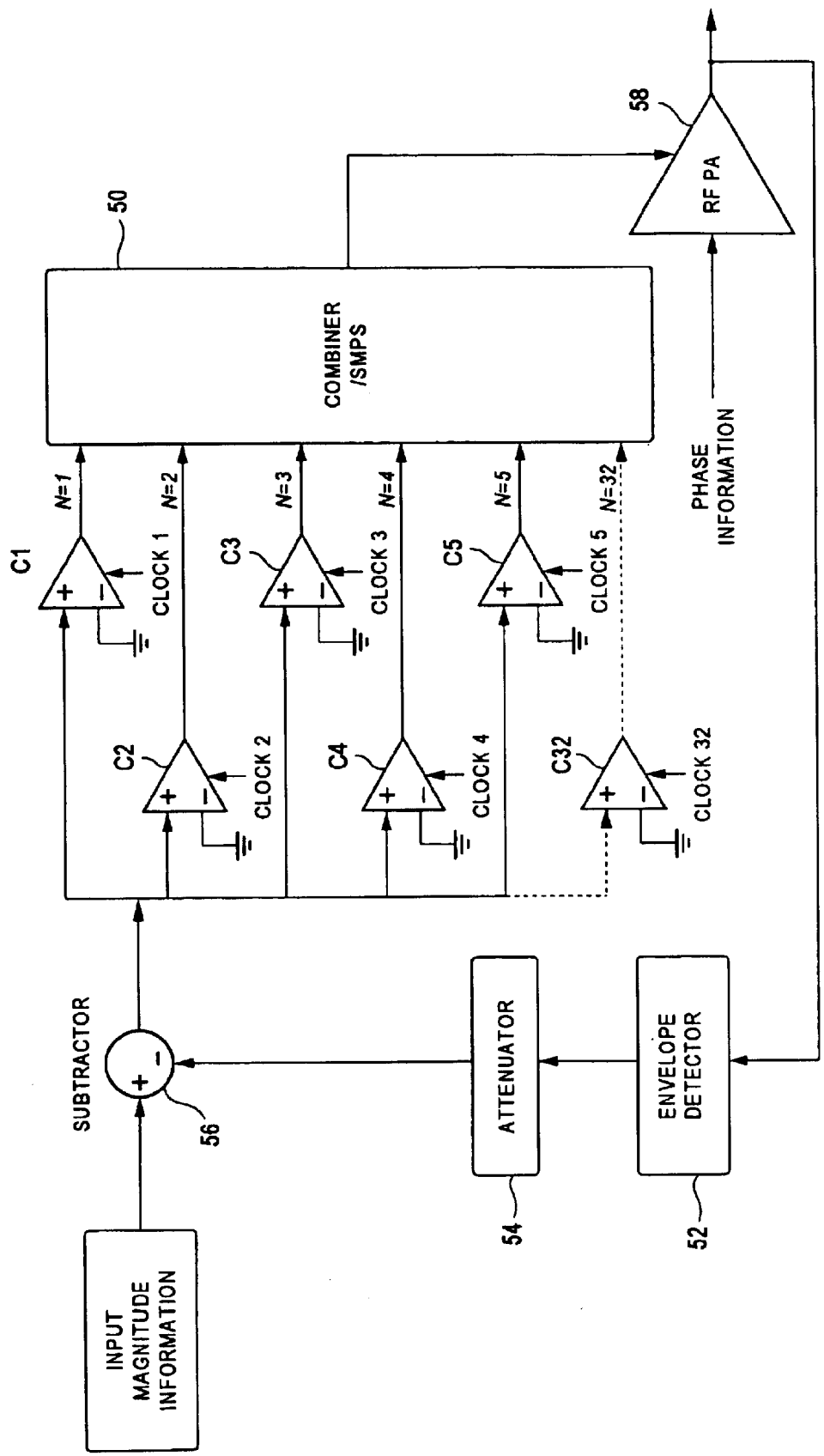
FIG. 5 is a simplified block diagram showing the manner in which interleaved delta modulation is implemented using a plurality of individual comparators offset in time and phase according to the present invention.

The aforementioned deficiencies in the prior art are overcome, in accordance with the present invention, by a time-interleaving mechanism that reduces the frequency of the waveform applied to the gate of the pass transistor while beneficially retaining the overall effective sampling rate. A simplified block diagram showing the manner in which interleaved delta modulation is implemented according to the present invention is shown in FIG. 5. As seen in FIG. 5, rather than employing a single bit comparator operating upon the gate of a single pass transistor, the modulation scheme of the present invention employs a plurality of discrete Delta Modulators, the precise number of which determining the overall quantization error. Thus, although in the illustrative example depicted in FIG. 5, the number of interleaved Delta Modulators is thirty two, it will be readily appreciated by those skilled in the art that the quantity of modulators may be increased or decreased, as desired, according to the particular requirements of a given application.

Figure 6A:
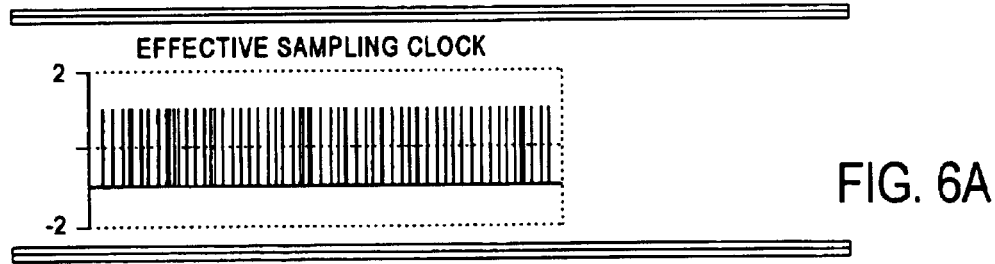
FIGS. 6A–6E depict an overall composite sampling clock rate (FIG. 6A) constituted by the individual clock rates associated with several representative comparators (FIGS. 6B–6E)
Figure 6B:
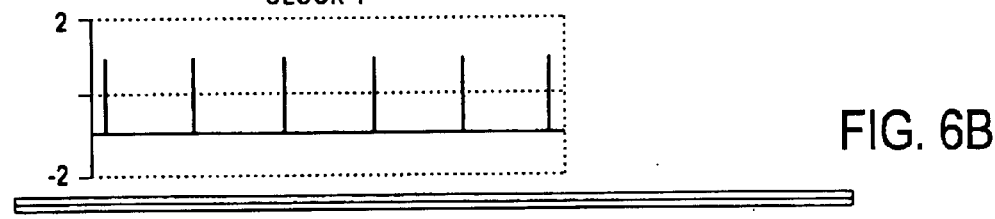
Figure 6C:
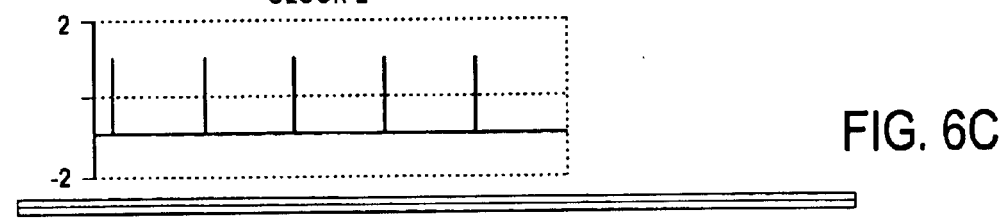
Figure 6D:
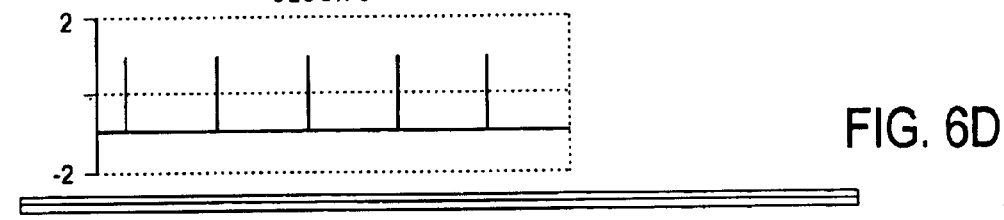
Figure 6E:
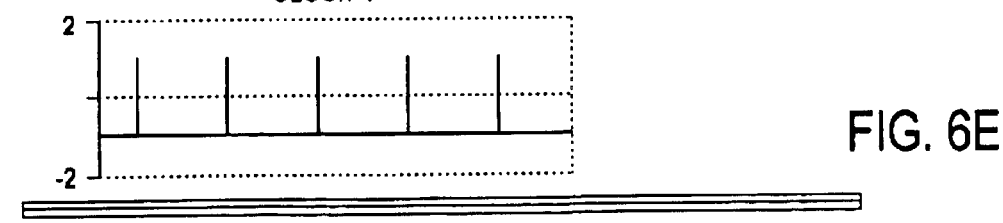
Figure 7A:
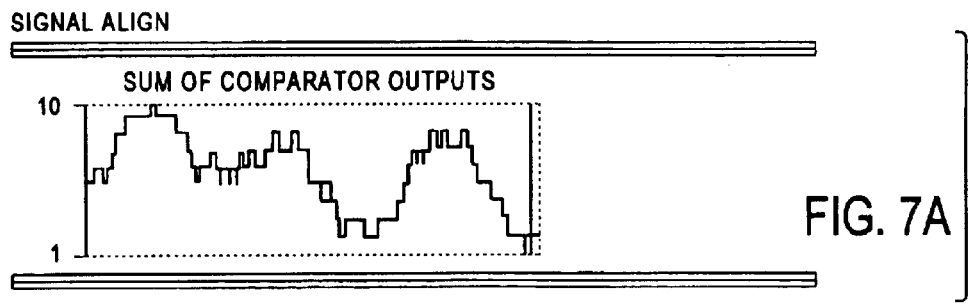
FIG. 7A is a graphical representation of an approximated waveform representing the sum of the comparator employed in the illustrative embodiment of FIG. 5.
Figure 7B:
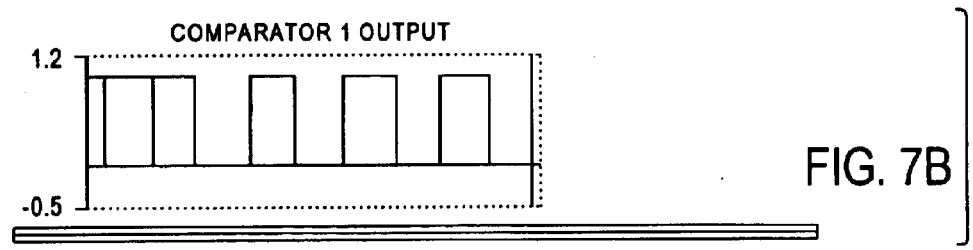
FIGS. 7B–7E are graphical representations of the representative individual outputs from the first four comparators ($C_1$, $C_2$, $C_3$ and $C_4$), respectively, from the illustrative embodiment of FIG. 5.
Figure 7C:
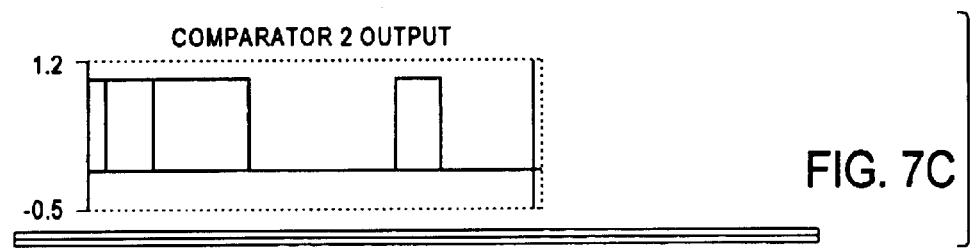
Figure 7D:
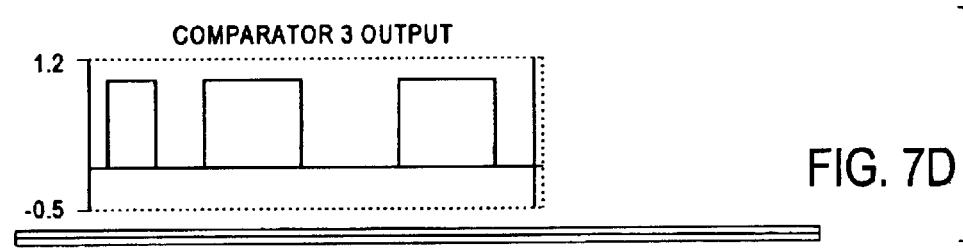
Figure 7E:
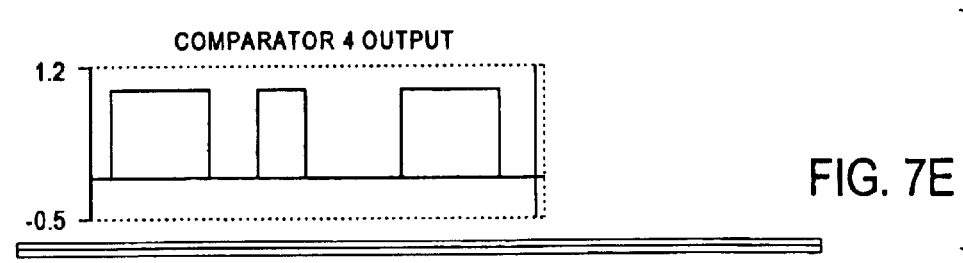

In any event, and with continued reference to FIG. 5, it will be seen that each DM includes a clocked comparator $C_1$ through $C_{32}$ which are sequentially strobed at a clock rate of 1/N times the system clock rate, where N is the total number of comparators (i.e., 32 in the embodiment depicted in FIG. 5). In accordance with an especially preferred embodiment of the present invention, the clock of each comparator is offset in phase 360°/N relative to the clock of each adjacent comparator. An overlay of all the individual clocks equates to the effective sampling clock depicted in FIG. 6A. The first four individual clocks are depicted in FIGS. 6B–6E, respectively. The comparator outputs are combined (i.e., integrated) in combiner module 50 to produce an approximation that is input to power amplifier 58. To ensure linearity, an envelope detector 52 and attenuator 54 provide a feedback loop from power amplifier 58 to subtractor 56, which collectively operate in a similar manner to that already described in connection with the conventional DM scheme of FIGS. 3 and 4. An approximated waveform representing the sum of the comparator outputs is shown in FIG. 7A, while representative individual outputs from the first four comparators ($C_1$, $C_2$, $C_3$ and $C_4$) are shown in FIGS. 7B–7E, respectively.

Figure 8A:
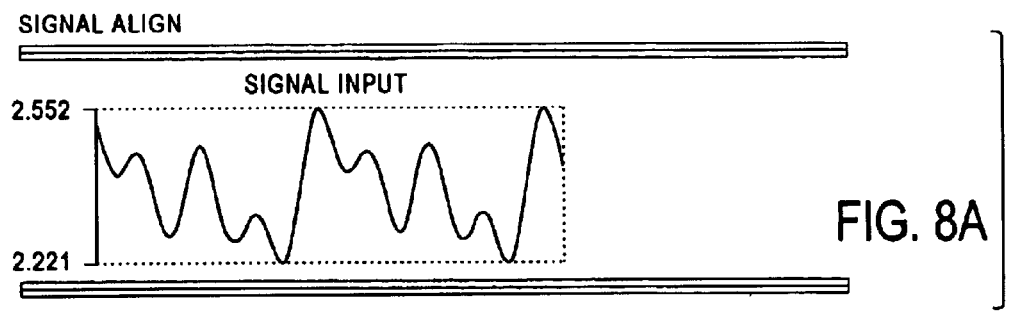
FIGS. 8A–8E are graphical representations based upon the results of a simulated interleaved delta modulation in accordance with the present invention, with FIG. 8A representing the input envelope signal or amplitude information as supplied by the DSP of FIG. 2, FIG. 8B representing the IDM approximation input to the subtractor of FIG. 5, FIG. 8C showing the error signal resulting from the comparison of the signals shown in FIGS. 8A and 8B, FIG. 8D depicting the sum of the comparator outputs, and FIG. 8E depicting the input envelope signal of 8A overlayed by the stepped approximation of FIG. 8D.
Figure 8B:
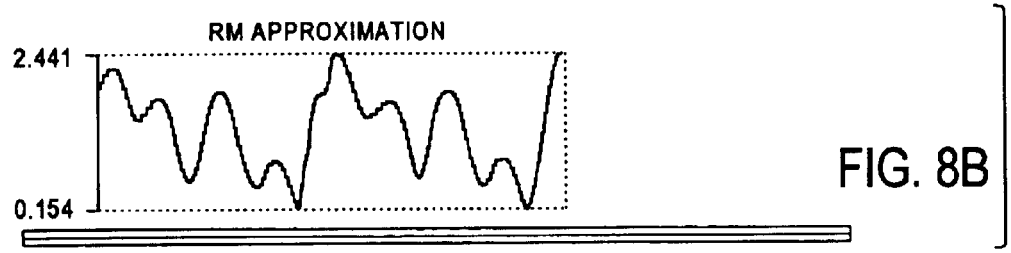
Figure 8C:
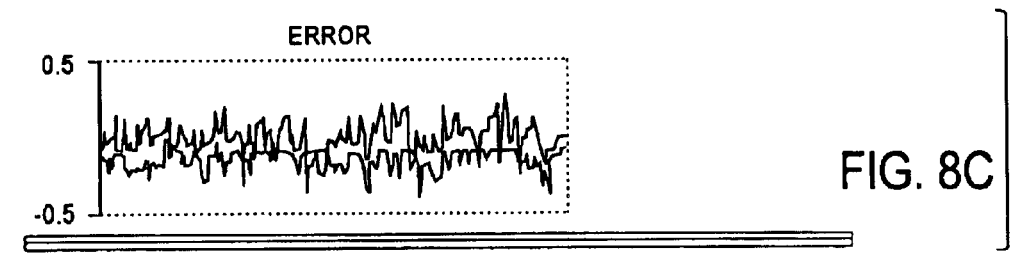
Figure 8D:
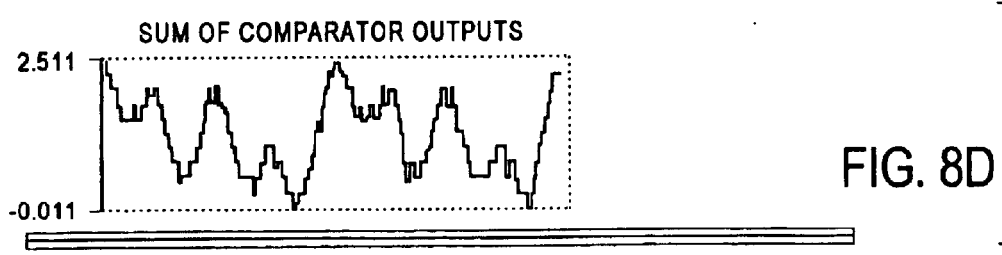
Figure 8E:
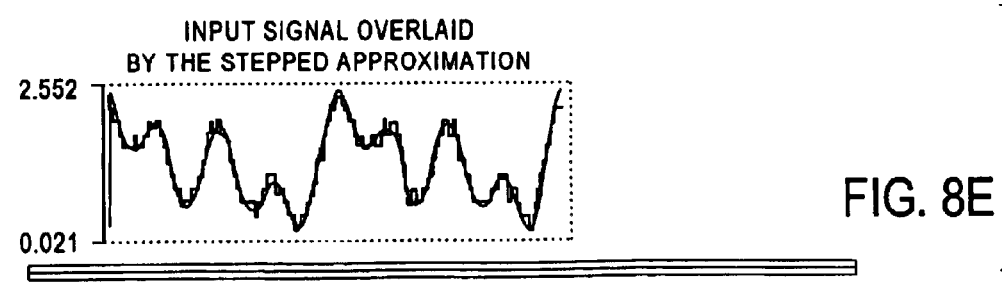

FIGS. 8A–8E are graphical representations based upon the results of a simulated interleaved delta modulation in accordance with the present invention. FIG. 8A represents the input envelope signal or amplitude information as supplied by DSP 24 (FIG. 2). FIG. 8B represents the IDM approximation input to the subtractor, while FIG. 8C shows the error signal resulting from the comparison of the signals shown in FIGS. 8A and 8B. FIG. 8D depicts the sum of the comparator outputs, while FIG. 8E depicts the input envelope signal of 8A overlayed by the stepped approximation of FIG. 8D.

Figure 9A:
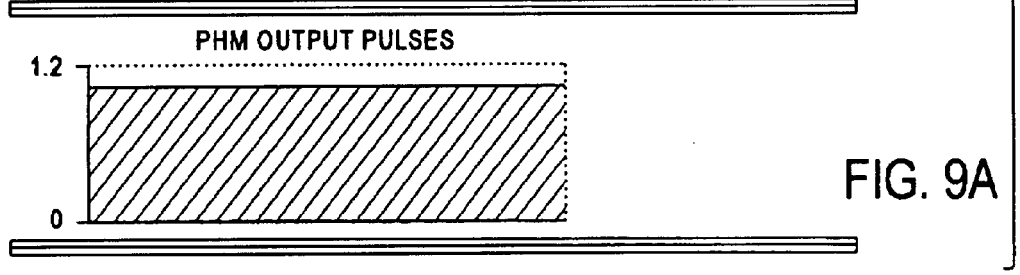
FIGS. 9A–9E are graphical representations comparing the pulse width modulation and simple delta modulation techniques with the interleaved delta modulation technique of the present invention, with FIGS. 9A and 9E illustrating the number and duration of pulses associated with pulse width modulation and simple delta modulation, respectively and FIGS. 9B–9D showing representative pulses output by several of the individual modulations employed in accordance with the present invention.
Figure 9B:
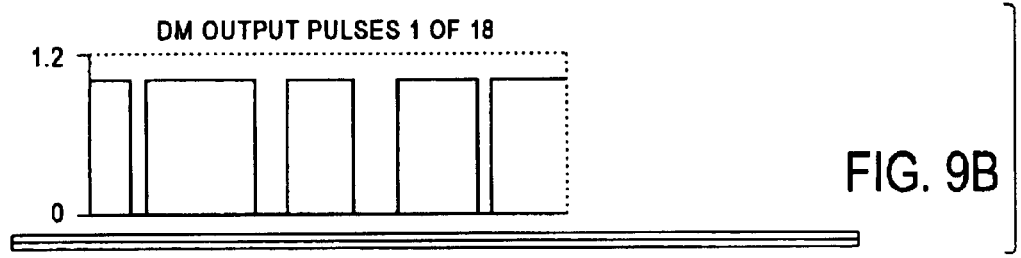
Figure 9C:
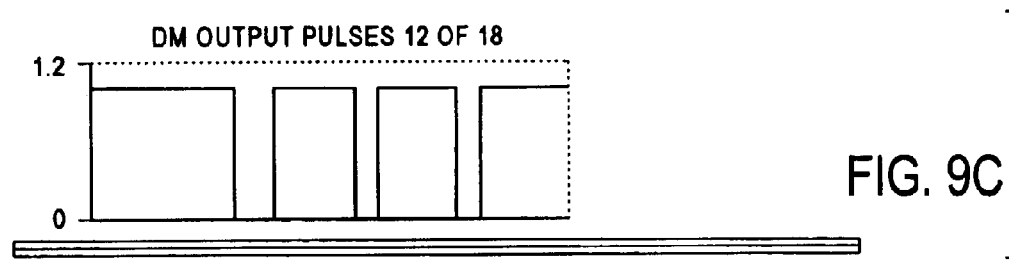
Figure 9D:
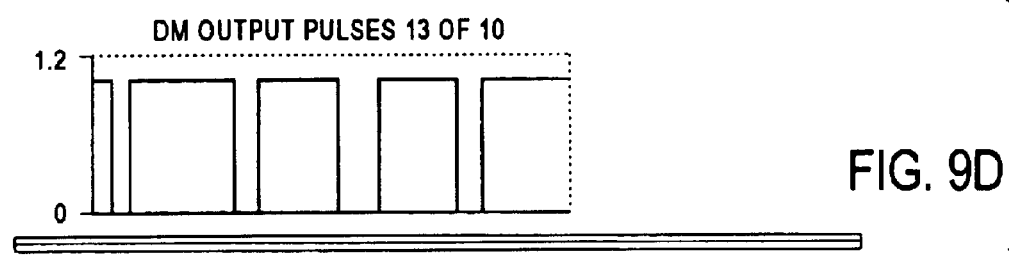
Figure 9E:
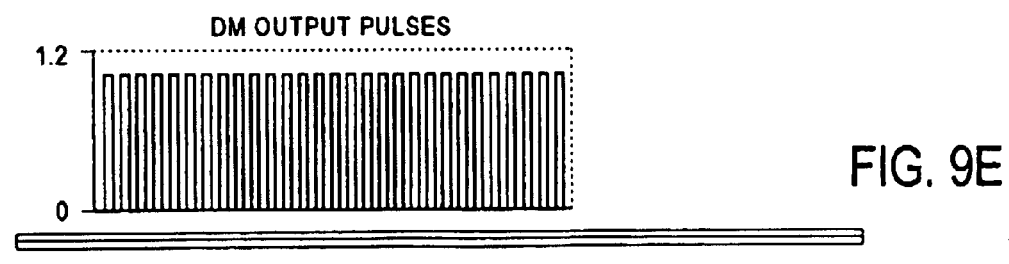

As discussed previously, it is the overall bandwidth and attendant sampling frequency which determine the overall efficiency of the modulation scheme. As will explained in greater detail shortly, the present invention obviates the application of short (narrow) pulses to the amplifier driving circuitry. Specifically, the output of each comparator is processed such that the corresponding pulses drive separate sampling elements, rather than, for example, a single pass transistor as in the prior art configuration shown in FIGS. 3 and 4. A comparison of the pulse width modulation and simple delta modulation techniques with the interleaved delta modulation technique of the present invention is presented in FIGS. 9A–9E. FIG. 9A illustrates that the greatest number of inefficient, narrow pulses is associated with pulse width modulation, followed by simple delta modulation (FIG. 9E). As represented by FIGS. 9B–9D, however, with the interleaved delta modulation technique of the present invention, the number and width of the pulses seen by any single sensing element is determined solely by the desired overall sampling rate and the total number of delta modulators employed. As will soon become apparent, even accounting for the larger number of active devices associated with the use of multiple sensing elements, in IDM, the amplifier is operated so much more efficiently that for a given degree of linearity, much less power is consumed.

FIGS. 10A–10C are graphical representations comparing of the results and methodology of the PWM and DM techniques, to the IDM technique of the presentation.

In PWM and DM, the switching loss is the average of $V_{dd}*I_{dd}*tr*f$, where $V_{dd}$ and $I_{dd}$ are the supply voltage and current of the passing transistor, tr is the rise (or fall) time at the switching point, and f is the number of switching occurrences. In DM, the switching loss is lower than that experienced with PWM because the switching occurrences happen less often. In IDM, the switching loss is given by the average of $N*V_{dd}*I_{dd}/N*tr*f$, where N is the number of modulators employed. In general, IDM will have about the same loss as DM because each pass transistor carries 1/N of the current but there are N transistors. In general, it may be said that PWM is the most linear but it is the least efficient, that DM is more efficient than PWM but it is less linear, and that IDM is more efficient than PWM and as efficient as DM. IDM is, in fact, a compromise between DM and PWM at reasonable switching frequencies. However, at very high switching rates, the pass transistor for DM and PWM may simply not be able to switch efficiently, regardless of the drive current. Thus, at higher frequencies, IDM becomes the only practical solution.

It will be recalled that in the illustrative embodiment depicted in FIG. 5, a five bit system with thirty comparators is contemplated, with the output from these comparators being fed directly to the combiner circuitry. For such a large number of comparators, it is impractical to combine their output using an equal number of pass transistors and inductors. In accordance with a preferred embodiment of the present invention, therefore, the combiner incorporates an encoder to encode the data from the comparators. Unlike a flash ADC, however, the comparator outputs may not be coded in a "thermometer" fashion. This is because in IDM the comparator outputs can be high or low at essentially any instant in time. As such, it is not possible to use a simple ROM encoder as is conventionally used in ADCs.

Figure 11:
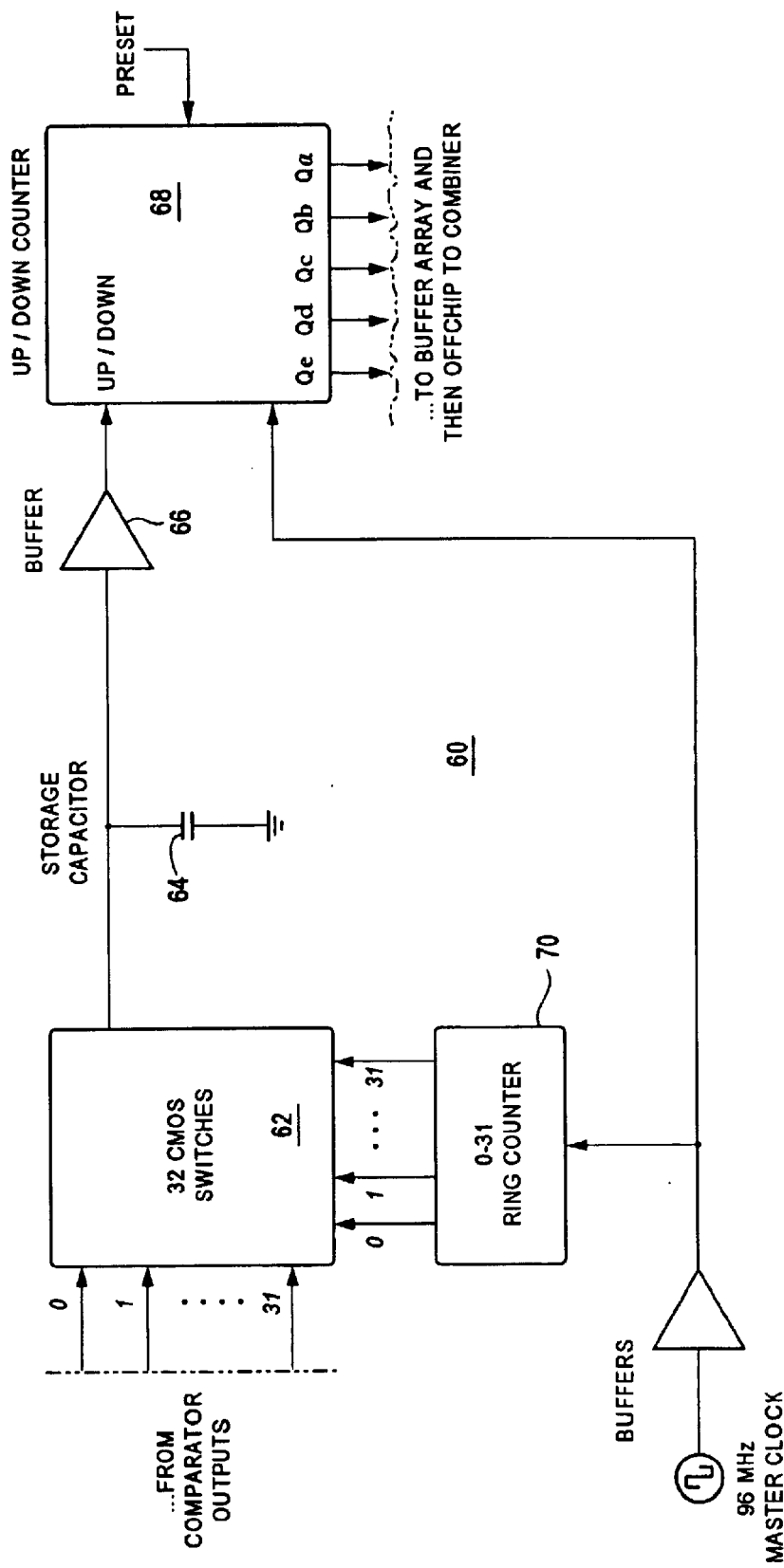
FIG. 11 is a block schematic diagram of an exemplary encoder which may be used to effectuate the objectives of the present invention.

An exemplary encoder 60 which may be used to effectuate the objectives of the present invention is shown in FIG. 11. Essentially, the output from each comparator is sampled using a S/H circuit that consists of an array 62 of N switches, where N is the number of comparator inputs, and a hold or storage capacitor 64. The comparators contain buffer circuitry that can sink and source current to charge/discharge the storage capacitor. Preferably, the capacitor is sized such that it charges and discharges at a steady rate, but is slow enough to eliminate glitches. The output of the S/H circuit is supplied, after passing through buffer 66, to an up/down counter 68. Buffer 66 provides isolation, enhancing both drive capability and signal regeneration. The output from a 0–N (31 in the 32 comparator illustrative embodiment) ring counter 70 turns on each switch in seriatim to feed that comparator value to the up/down counter. As will be readily ascertained by those skilled in the art, up/down counter 68 counts up or down in a binary manner depending on the comparator value.

Figure 12A:
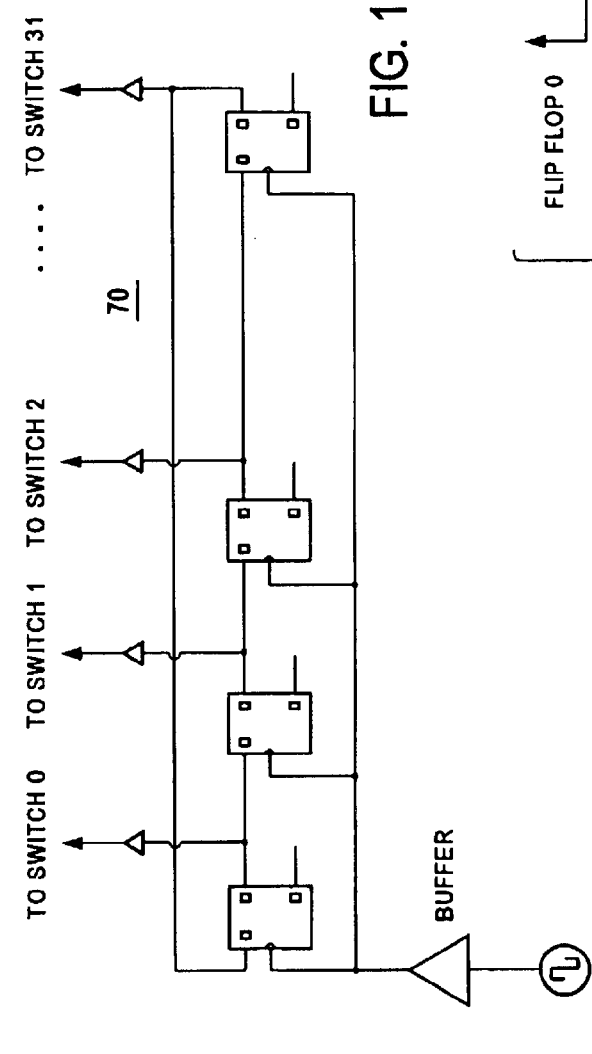
FIG. 12A depicts, in greater detail, the ring counter of the encoder of FIG. 11.
Figure 12B:
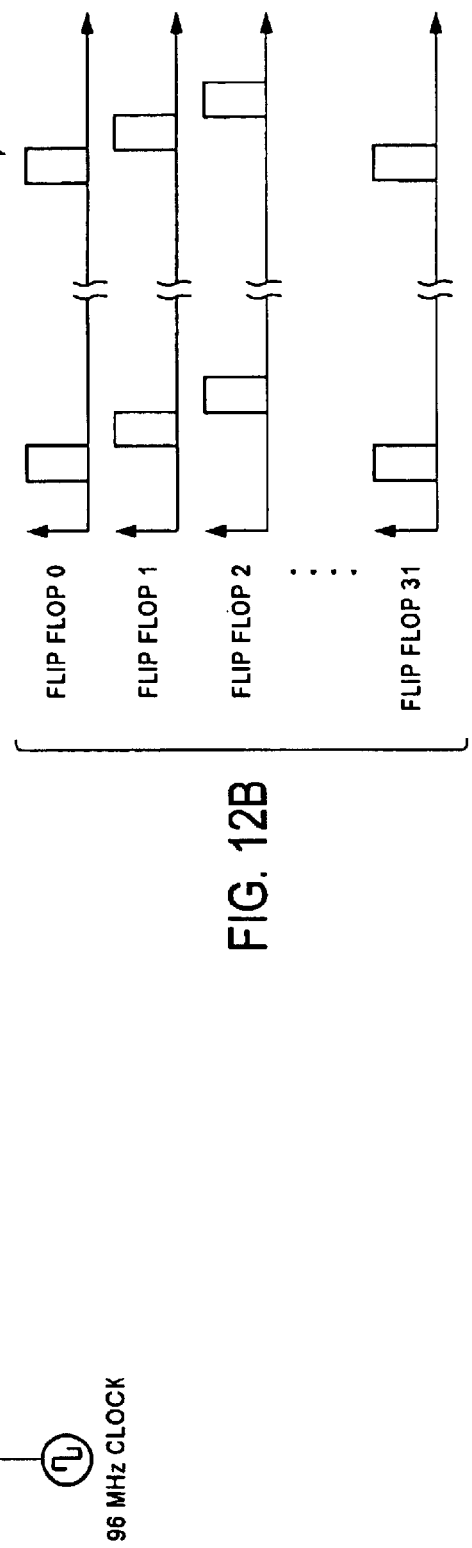
FIG. 12B illustrates graphically the signal output by the ring counter as the "1" is shifted from one stage of a shift register to the next.

Turning now to FIG. 12A, ring counter 70 of the encoder of FIG. 11 is shown in greater detail. As seen in FIG. 12A, ring counter 70 is a form of shift-register in which the "1" is shifted from one stage to the next. When the "1" gets to the last stage, it then repeats the cycle, as graphically illustrated in FIG. 12B. In this manner, the ring counter outputs sequentially energize each switch of the S/H array 62. A more detailed description of the interaction between the ring counter and the S/H array of the illustrative decoder of FIG. 11 is as follows: a separate switch is energized by the ring counter to read each comparator's output sequentially, the switched being energized so that the comparator outputs are sampled at 96 MHz/32 MHz, (i.e. 3 MHz) the same rate as that at which the comparators operate. As each switch is turned on by ring counter 70, its output is sampled onto hold capacitor 64. The value on the capacitor determines whether the up/down counter counts up or down. Such an arrangement is simple yet robust. Specifically, because the digital outputs from the comparators are being sampled, the S/H performance need not be perfect as only the highs and lows are significant.

Up/down binary counter 68 may be configured as a synchronous binary counter that counts up or down depending upon the level at the up/down port. J-K Flip/Flops are used as the toggle devices, and XNOR gates are used to control the up/down direction. The up/down counter logic, in which UP=1 and DOWN=0, is presented in Table I, below:

TABLE I

| Level | Qe | Qd | Qc | Qb | Qa |
|---|---|---|---|---|---|
| 0  | 0 | 0 | 0 | 0 | 0 |
| 1  | 0 | 0 | 0 | 0 | 1 |
| 2  | 0 | 0 | 0 | 1 | 0 |
| 3  | 0 | 0 | 0 | 1 | 1 |
| 4  | 0 | 0 | 1 | 0 | 0 |
| 5  | 0 | 0 | 1 | 0 | 1 |
| 6  | 0 | 0 | 1 | 1 | 0 |
| 7  | 0 | 0 | 1 | 1 | 1 |
| 8  | 0 | 1 | 0 | 0 | 0 |
| 9  | 0 | 1 | 0 | 0 | 1 |
| 10 | 0 | 1 | 0 | 1 | 0 |
| 11 | 0 | 1 | 0 | 1 | 1 |
| 12 | 0 | 1 | 1 | 0 | 0 |
| 13 | 0 | 1 | 1 | 0 | 1 |
| 14 | 0 | 1 | 1 | 1 | 0 |
| 15 | 0 | 1 | 1 | 1 | 1 |
| 16 | 0 | 0 | 0 | 0 | 0 |
| 17 | 1 | 0 | 0 | 0 | 1 |
| 18 | 1 | 0 | 0 | 1 | 0 |
| 19 | 1 | 0 | 0 | 1 | 1 |
| 20 | 1 | 0 | 1 | 0 | 0 |
| 21 | 1 | 0 | 1 | 0 | 1 |
| 22 | 1 | 0 | 1 | 1 | 0 |
| 23 | 1 | 0 | 1 | 1 | 1 |
| 24 | 1 | 1 | 0 | 0 | 0 |
| 25 | 1 | 1 | 0 | 0 | 1 |
| 26 | 1 | 1 | 0 | 1 | 0 |
| 27 | 1 | 1 | 0 | 1 | 1 |
| 28 | 1 | 1 | 1 | 0 | 0 |
| 29 | 1 | 1 | 1 | 0 | 1 |
| 30 | 1 | 1 | 1 | 1 | 0 |
| 31 | 1 | 1 | 1 | 1 | 1 |

Essentially, and with continuing reference to Table I, Qa toggles UP on each clock cycle, Qb toggles UP at half the rate of Qa, Qc toggles UP when Qa and Qb are high, Qd toggles UP when Qa, Qb and Qc are high, and Qe toggles UP when Qa, Qb, Qc and Qd are high (except when up/down=1, also). Conversely, Qa toggles DOWN on each on each clock cycle, Qb toggles DOWN when Qa is low, Qc toggles DOWN when Qa and Qb are low, Qd toggles DOWN when Qa, Qb and Qc are low, and Qe toggles DOWN when Qa, Qb, Qc and Qd are low (except when up/down=0, also). To prevent "cycling", when counting up, if Qa through Qe are all equal to 1, then up/down counter 68 counts down (i.e., at 31, do not drop to zero, but go to 30, instead). When counting down, if Qa through Qe are all equal to 0, then up/down counter 68 counts up (i.e., at 0, do not go to 31, but go to 1, instead). To ensure that the outputs from each flip-flop are set to zero at start-up, a dedicated preset control may be employed. When the preset is low, the output from the flip flop is low, when the preset is high, there is normal operation.

Figure 13:
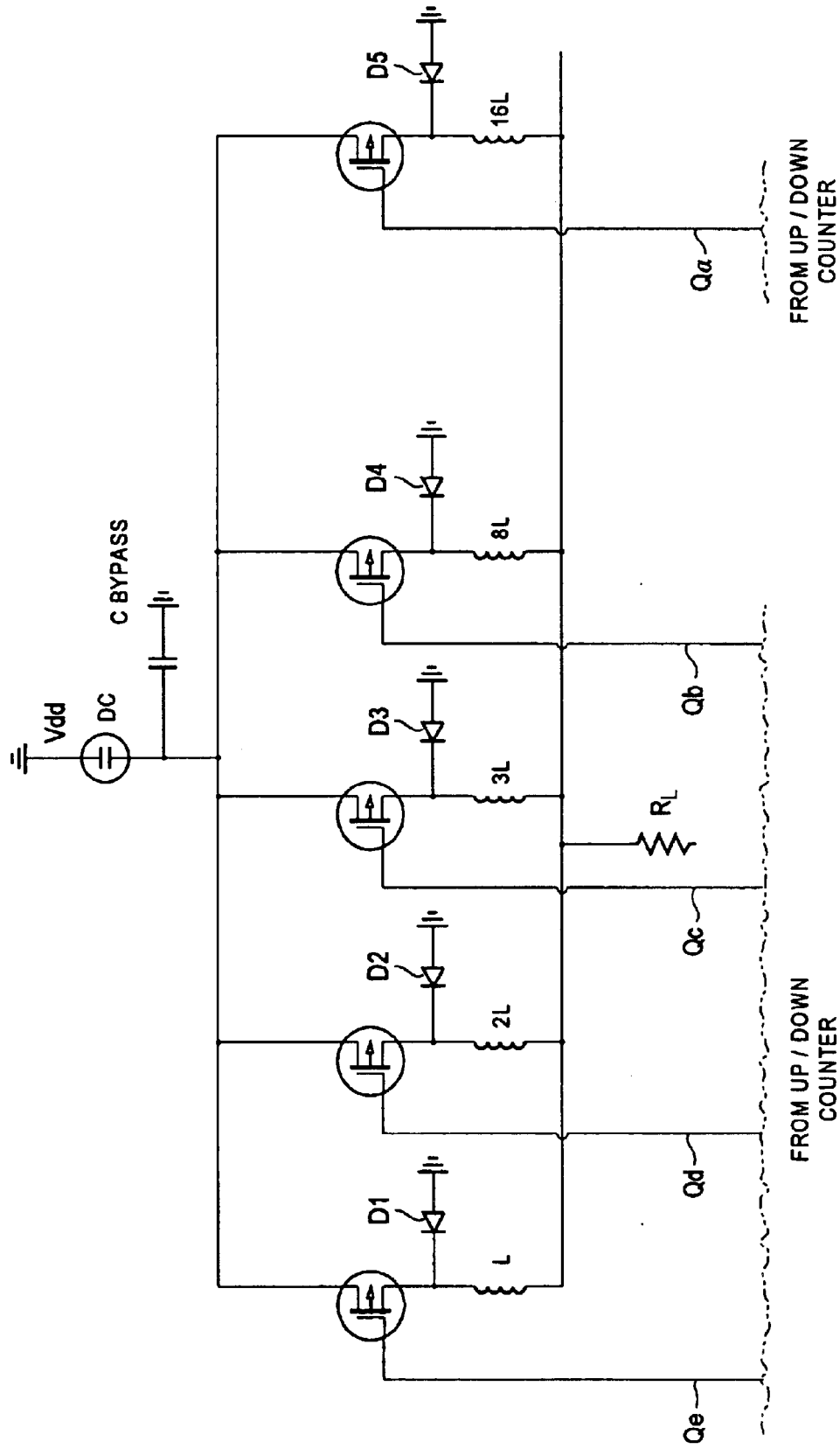
FIG. 13 shows an illustrative embodiment of a combiner 50 which may be employed to implement the exemplary IDM arrangement depicted in FIG. 5.
Figure 14:
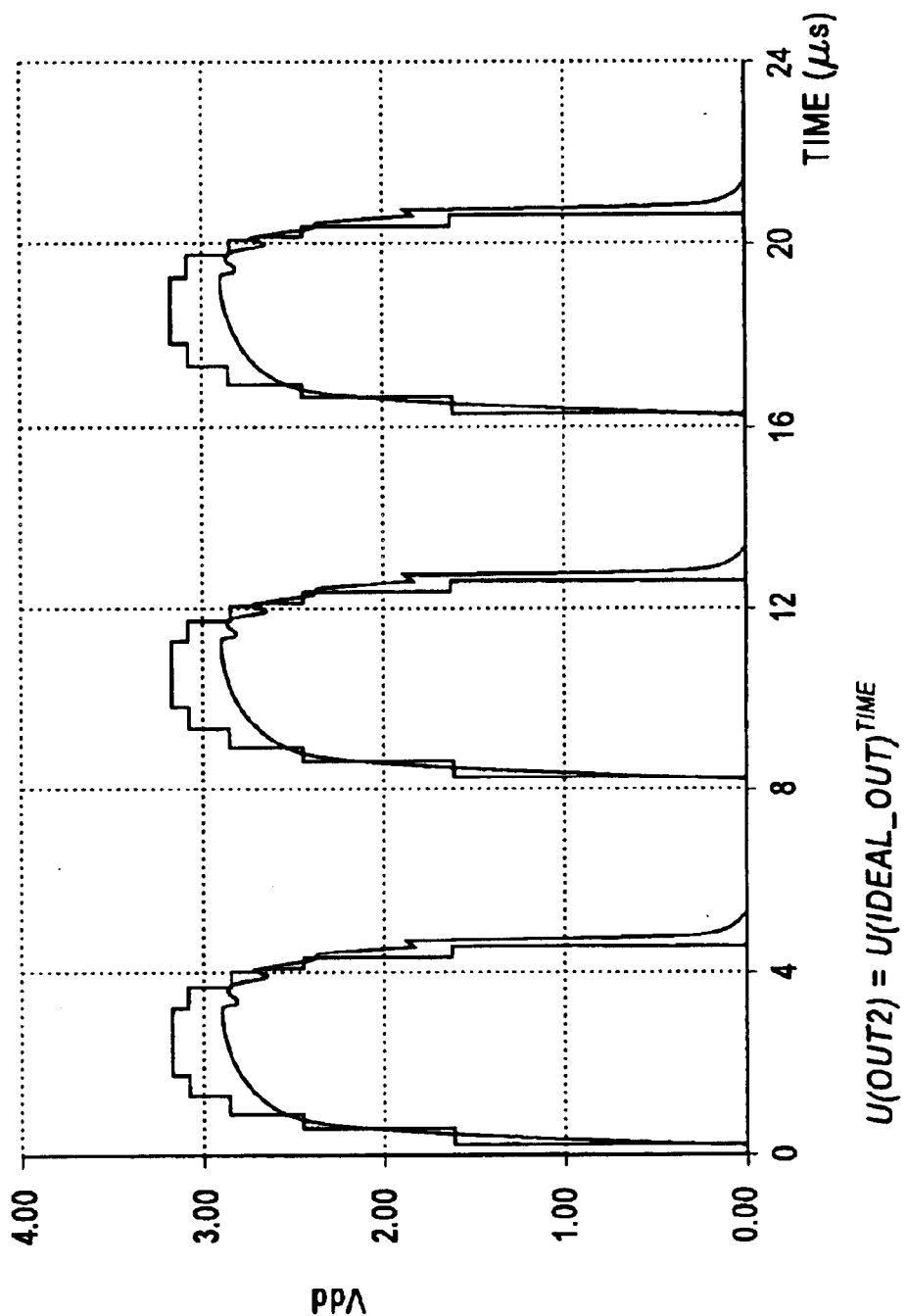
FIG. 14 is graphical representation comparing an ideal supply voltage with the binary weighted output achieved by the illustrative arrangement of FIG. 13.

With reference now to FIG. 14, there is shown an illustrative embodiment of a combiner 50 which may be employed to achieve the exemplary IDM arrangement depicted in FIG. 5. In the illustrative embodiment of FIG. 14, the combiner 50 is configured as a binary-weighted Class S combiner so that it may be used to decode the IDM data encoded by encoder 60. The less practical alternative would be to process thirty two individual inputs at the combiner. In any event, it will be readily appreciated by those skilled in the art that a Class S modulator behaves like a single pole, double throw (SPDT) switch, chopping the DC supply voltage. Since the embodiment of FIGS. 11–13 contemplates five binary outputs from encoder 60, (Qa, Qb, Qc, Qd and Qe), combiner 50 employs five switch transistors which respectively serve as parallel Class S modulators. Any switch transistor capable of turning on and off fully within the voltage range may be employed for this purpose. By way of illustrative example, power PMOS switch transistors possess the on/off behavior within a 0 to 3.3V input voltage range and are therefore deemed to be idea for the configuration of FIG. 14.

A respective freewheel diode D1 through D5 is associated with each saturated switch mode transistor in order to reduce the kickback effect attributable to instantaneous stopping of current flow through the corresponding inductors (L, 2L, 4L, 8L and 16L) which collectively combine to supply current to the load [i.e., the power amplifier 58 (FIG. 5)]. Thus, the freewheeling diodes prevent any large voltage build-up across the inductors and increase the efficiency by ensuring that the inductor current continues to flow when the switching element turns off. The inductance value of 2L is selected so as to be twice that of L, 4L to be twice that of 2L, 8L to be twice that of 4L and 16L to be twice that of 8L. The largest inductor, 16L is used to carry the least significant bit (LSB), which is at the lowest current, while the smallest inductor L carries the most significant bit, which is at the highest current. Illustratively, when Qa through Qe are all low, the output voltage applied to the power amplifier (as idealized by load RL) is 0. When Qa through Qe are all high, the output voltage applied to the power amplifier is equal to the source voltage or Vdd. A graphical representation, comparing an ideal supply voltage with the binary weighted output achieved by the illustrative arrangement of FIG. 13 is shown in FIG. 14

It should be noted that an alternative approach to the use of saturated switch mode amplifiers as in the embodiment of FIG. 14 is to use class-D amplifiers as the gate driving circuitry for power MOSFETS. These gate drivers supply the gate current and determine how fast the device capacitances charge and discharge. Moreover, resistors may be used instead of inductors to provide a wider bandwidth of operation. These resistors are easily integrated within an IC as separate components or as part of the transistor structure. The flyback diodes D1 through DS are not needed in this scenario. As such, the elimination of the inductors and diodes might greatly reduce the size and expense of the combiner circuit. There is, however, a price to be paid in terms of circuit operation as the efficiency will be reduced. However, for filtered digitally modulated signals where the waveform varies about some average value, the efficiency may still be maintained up into the 70% range.

Figure 15:
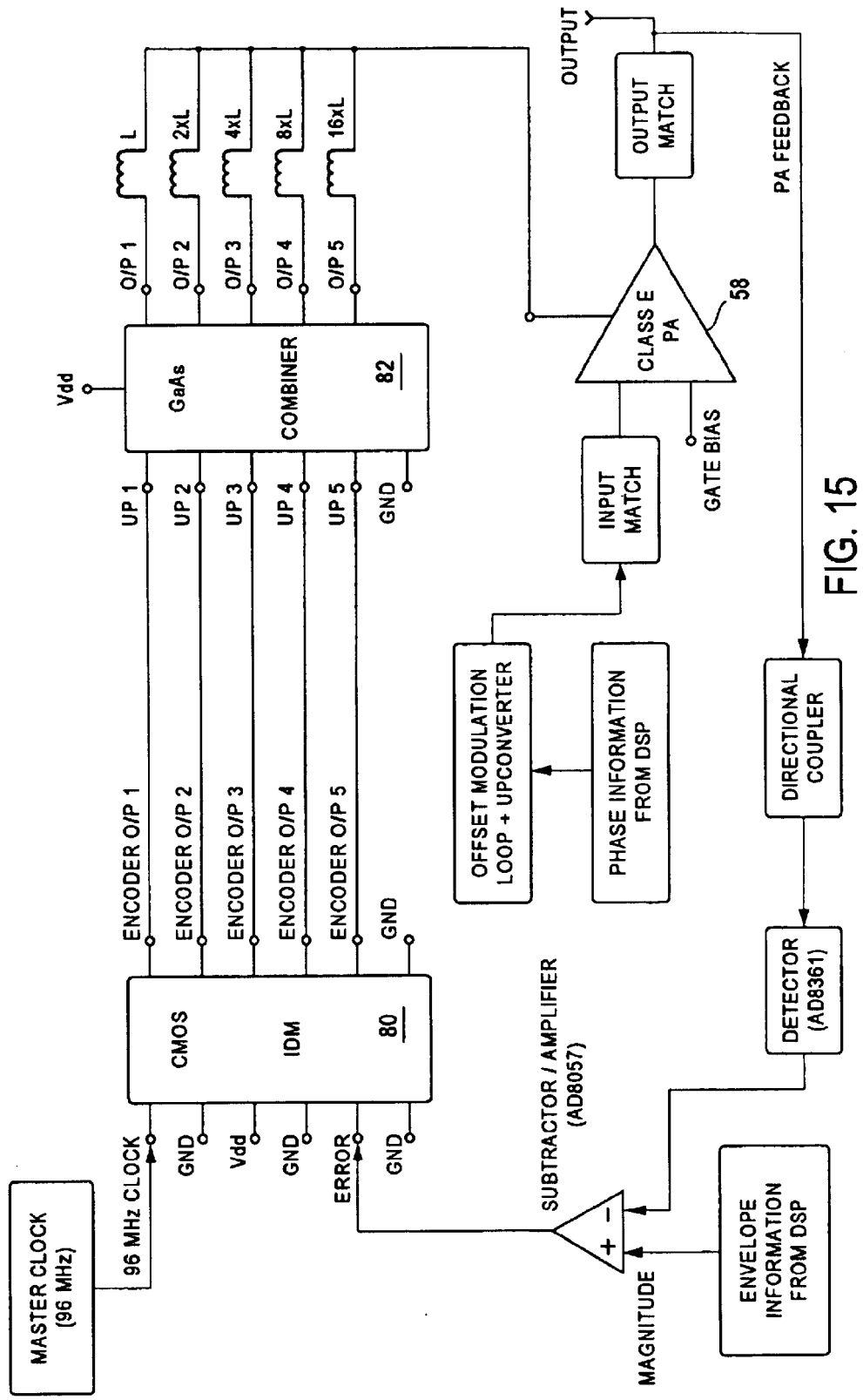
FIG. 15 depicts an illustrative transmitter configuration, aggregating the comparator/encoder functionality corresponding to FIGS. 11–12 into a unitary CMOS module, and the power switching portion of the combiner functionality corresponding to FIGS. 13 and 14 into a unitary GaAs module.

An illustrative transmitter configuration, aggregating the comparator/encoder functionality described in connection with FIGS. 11–12 into a unitary CMOS module 80, and the power switching portion of the combiner functionality described in connection with FIGS. 13 and 14 into a unitary GaAs module 82, is depicted in FIG. 15, in which like elements are represented by like numerals. Up until now, the operation of the power amplifier 58, which as will be recalled, has its supply voltage modulated in accordance with the novel interleaved delta modulation technique hereinbefore described, has been omitted. With continued reference to FIG. 15, it will be borne in mind that a high input drive current supplied from the combiner causes the amplifier transistor to behave as an ideal switch. Since it is not possible to have high voltage and high current, simultaneously, through an ideal switch, there is no power dissipation in the transistor and, therefore, 100% efficiency. In a switched mode power amplifier, the output power is proportional to the square of the supply voltage Vdd. Because the present invention seeks high speed operation, the voltage and current of the switch may be simultaneously non zero, causing power loss. For power amplifier 58, class E operation is preferred due to such finite switching times of the transistors. At turn on, a reactive network shapes the switch voltage to have a zero value and a zero slope across the switch.

From the foregoing, it will be appreciated that the interleaved delta modulation technique of the present invention provides many substantial benefits over the prior art. First, it allows a higher frequency of operation. This is achieved by allowing a larger minimum pulse width for a given sampling frequency. Second, IDM allows reduced comparator specifications. Illustratively, a clocked individual comparator forming part of an interleaved scheme of many such comparators might be required to switch at 200 KHz. Such a comparator is much easier to design than one operating at 2 MHz, as would be the case for DM. Moreover, a comparator employed by the present invention would have higher gain and require lower current at the lower switching frequency. Third, the present invention simplifies filtering requirements. Because the combiner creates an essentially stepped approximation to the input signal, the output filter need only remove the sharp edges and/or ripple of the approximation. Moreover, since the frequency components of the edge ripple are at such a high frequency, the filter will consist of small-value component values. Illustratively, a cut-off frequency of about 10 times higher than the highest input signal frequency. A smaller filter will also provide a reduced delay, an important consideration for recombination of the phase and magnitude signals. Fourth, power losses are kept low because of the reduced number of transitions inherent in DM operation as compared with PWM. Finally, the present invention accommodates the use of a lower frequency clock. The sampling occurs at a 1/N fraction of the full sampling rate, where N is the number of interleaved comparators. As will be readily appreciated by those skilled in the art, a lower frequency clock will have better spectral purity and will introduce less additional distortion into the sampling process.

Various techniques may be employed to further enhance IDM in accordance with the present invention.

For example, a higher overdrive might be used to give reduced on-resistance. Since the battery voltage is limited to, say 3.6 V, by system requirements, this may necessitate implementation of a DC-DC converter to increase the supply voltage, and hence, the maximum voltage that the gate signal can swing up to. Additionally, it might be desirable to use a smaller gate length process. This would give a higher cross over capacitance and smaller inductance, both reducing the on-resistance. The parasitic capacitances will also decrease with decreasing gate length. Also, when laying out the devices, one should ensure that the area of the transistors is kept to a minimum to minimize parasitic capacitance and parasitic resistance. Of further advantage would be to reduce the amplitude of the input signal before it is quantized, without losing any information. This will reduce the quantization error and allow lower sampling rates to be used. This will then reduce the switching loss. Amplification can take place after the quantization has occurred. Finally, it might be advantageous to incorporate gate driver circuitry to quickly charge and discharge the capacitances in the pass transistor.

Although the present invention has been described in detail, those skilled in the art should understand that they can make various changes, substitutions and alterations herein without departing from the spirit and scope of the invention in its broadest form.

What is claimed is:

1. A transmitter for directly modulating an RF carrier with a complex baseband waveform, comprising:

a programmable device adapted to generate amplitude and phase information collectively corresponding to a selected complex baseband waveform;

a signal generator adapted to generate an RF carrier whose phase is responsive to phase information generated by said programmable device;

a plurality of delta modulators, each delta modulator being operative to sample an error signal at a time period offset from all other delta modulators to thereby generate streams of pulses collectively approximating said amplitude information; and an amplifier coupled to said signal generator and receiving said RF carrier with phase information, a supply voltage of the amplifier being adjusted in accordance with approximated amplitude information represented by the streams of pulses such that an output voltage of the amplifier varies substantially linearly with changes in said supply voltage, whereby said amplitude information and phase information are both impressed upon the RF carrier.

2. The transmitter according to claim 1, wherein each said delta modulator comprises a comparator individually clocked at a time offset from each adjacent comparator by a 1/N multiple of a total sampling rate, where N is a total number of comparators.

3. The transmitter according to claim 2, wherein each said comparator is clocked at a phase offset 360°/N from each adjacent comparator.

4. The transmitter according to claim 1, further including an encoder for digitally encoding the streams of pulses output by said delta modulators.

5. The transmitter according to claim 4, wherein said encoder includes a plurality of switches, each switch being associated with a corresponding modulator and being toggled sequentially such that each switch is turned on to read a corresponding modulator pulse stream once during each sampling period.

6. The transmitter according to claim 5, further including a ring counter comprising a series of N flip flops, where N is a number of modulators to be sampled by said plurality of switches.

7. The transmitter according to claim 5, further including an m-bit up/down counter receiving an output of said plurality of switches, where m is a binary representation of the number of modulators to be sampled by said plurality of switches.

8. The transmitted according to claim 7, further including a class S modulator comprising m parallel switching mode transistors, each switching mode transistor receiving an input from said up/down counter.

9. A method of operating a transmitter to transmit a complex baseband waveform modulated onto an RF carrier comprising the steps of:

receiving amplitude information derived from said complex baseband waveform;

receiving an RF carrier bearing phase information derived from said complex baseband waveform;

sampling, with a plurality of delta modulators, an error signal, each delta modulator sampling at a time period offset from all other modulators to thereby generate streams of pulses collectively approximating said amplitude information; and receiving said RF carrier with phase information at an amplifier, and adjusting a supply voltage of the amplifier in accordance with approximated amplitude information represented by the streams of pulses such that an output voltage of the amplifier varies substantially linearly with changes in said supply voltage, whereby said amplitude information and phase information are both impressed upon the RF carrier.

* * * * *